(12) United States Patent
Wang et al.

(10) Patent No.: US 11,770,957 B2
(45) Date of Patent: Sep. 26, 2023

(54) DISPLAY PANEL, MANUFACTURING METHOD OF DISPLAY PANEL, AND DISPLAY APPARATUS

(71) Applicant: BOE Technology Group Co., Ltd., Beijing (CN)

(72) Inventors: Bingwei Wang, Beijing (CN); Fangxu Cao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 195 days.

(21) Appl. No.: 17/357,397

(22) Filed: Jun. 24, 2021

(65) Prior Publication Data

US 2022/0199704 A1 Jun. 23, 2022

(30) Foreign Application Priority Data

Dec. 21, 2020 (CN) .......................... 202011515440.2

(51) Int. Cl.
*H10K 59/35* (2023.01)
*H10K 50/844* (2023.01)
*H10K 50/84* (2023.01)
*H10K 71/00* (2023.01)
*H10K 59/12* (2023.01)

(52) U.S. Cl.
CPC ......... *H10K 59/353* (2023.02); *H10K 50/844* (2023.02); *H10K 50/846* (2023.02); *H10K 71/00* (2023.02); *H10K 59/1201* (2023.02)

(58) Field of Classification Search
CPC ............. H10K 59/353; H10K 59/1201; H10K 50/846; H10K 50/844; H10K 71/00
See application file for complete search history.

(56) References Cited

U.S. PATENT DOCUMENTS

| 2015/0028307 A1 | 1/2015 | Kim et al. |
| 2020/0127230 A1* | 4/2020 | Moon ..................... B32B 27/20 |
| 2020/0144522 A1* | 5/2020 | Jung .................... H10K 50/844 |
| 2020/0243778 A1* | 7/2020 | Li ........................ H10K 77/111 |

(Continued)

FOREIGN PATENT DOCUMENTS

| CN | 109923676 A | 6/2019 |
| CN | 110098233 A | 8/2019 |

(Continued)

OTHER PUBLICATIONS

CN202011515440.2 second office action.
CN202011515440.2 first office action.

*Primary Examiner* — Shaun M Campbell
(74) *Attorney, Agent, or Firm* — IPRO, PLLC

(57) ABSTRACT

Disclosed are a display panel, a manufacturing method of the display panel, and a display apparatus. The display panel includes: a base substrate; and a pixel circuit film layer disposed on the base substrate. The display panel has a plurality of island regions, opening regions between the adjacent island regions, and bridge regions connecting adjacent island regions. Where the plurality of island regions are provided therein the base substrate and the pixel circuit film layer; the opening regions each is provided with a first via hole, and the first via hole runs through the base substrate and the pixel circuit film layer. The display panel further comprises: deformable components each filling the first via hole; where each deformable component comprises an elastic material.

16 Claims, 8 Drawing Sheets

(56) References Cited

U.S. PATENT DOCUMENTS

2021/0225961 A1  7/2021 Sun et al.
2021/0234135 A1* 7/2021 Kim .................... H10K 59/131
2021/0376012 A1  12/2021 Li et al.

FOREIGN PATENT DOCUMENTS

CN    111341210 A    6/2020
CN    111799392 A    10/2020

* cited by examiner

DISPLAY PANEL, MANUFACTURING METHOD OF DISPLAY PANEL, AND DISPLAY APPARATUS

CROSS REFERENCE TO RELATED APPLICATION

This application is based on and claims priority under 35 U.S.C 119 to Chinese Patent Application No. 202011515440.2, filed on Dec. 21, 2020, in the China National Intellectual Property Administration. The entire disclosure of the above application is incorporated herein by reference.

FIELD

The application relates to the technical field of display, in particular to a display panel, a manufacturing method of the display panel and a display apparatus.

BACKGROUND

Stretchable display, as a next generation novel morphologic display technology of flexible display, can be applied in the more flexible and imaginative application scenarios.

SUMMARY

Embodiments of the disclosure provide a display panel, a manufacturing method of the display panel, and a display apparatus.

An embodiment of the disclosure provides a display panel. The display panel includes: a base substrate; and a pixel circuit film layer disposed on the base substrate. The display panel has a plurality of island regions, opening regions between the adjacent island regions, and bridge regions connecting adjacent island regions. Where the plurality of island regions are provided therein the base substrate and the pixel circuit film layer; the opening regions each is provided with a first via hole, and the first via hole runs through the base substrate and the pixel circuit film layer. The display panel further comprises: deformable components each filling the first via hole; where each deformable component comprises an elastic material.

An embodiment of the disclosure provides a manufacturing method of the display panel, where the display panel includes: a plurality of island regions, opening regions located between the adjacent island regions, and bridge regions connecting the adjacent island regions. The method includes: providing a base substrate, forming a pixel circuit film layer on the base substrate, and forming first via holes penetrating the base substrate and the pixel circuit film layer in the opening regions; and filling each first via hole with an elastic material to form a deformable structure.

An embodiment of the disclosure provides a display apparatus, including a display panel. The display panel includes a base substrate; and a pixel circuit film layer disposed on the base substrate. The display panel has a plurality of island regions, opening regions between the adjacent island regions, and bridge regions connecting adjacent island regions. Where the plurality of island regions are provided therein the base substrate and the pixel circuit film layer; the opening regions each is provided with a first via hole, and the first via hole runs through the base substrate and the pixel circuit film layer. The display panel further comprises: deformable components each filling the first via hole; where each deformable component comprises an elastic material.

BRIEF DESCRIPTION OF THE DRAWINGS

In order to more clearly illustrate the technical solutions in the embodiments of the disclosure, the drawings used in the description of the embodiments are briefly described below, and it is obvious that the drawings in the description below are only some embodiments of the disclosure, and that other drawings can be obtained from these drawings without involving any inventive effort as for those ordinarily skilled in the art.

DETAILED DESCRIPTION OF THE EMBODIMENTS

Figure 1:
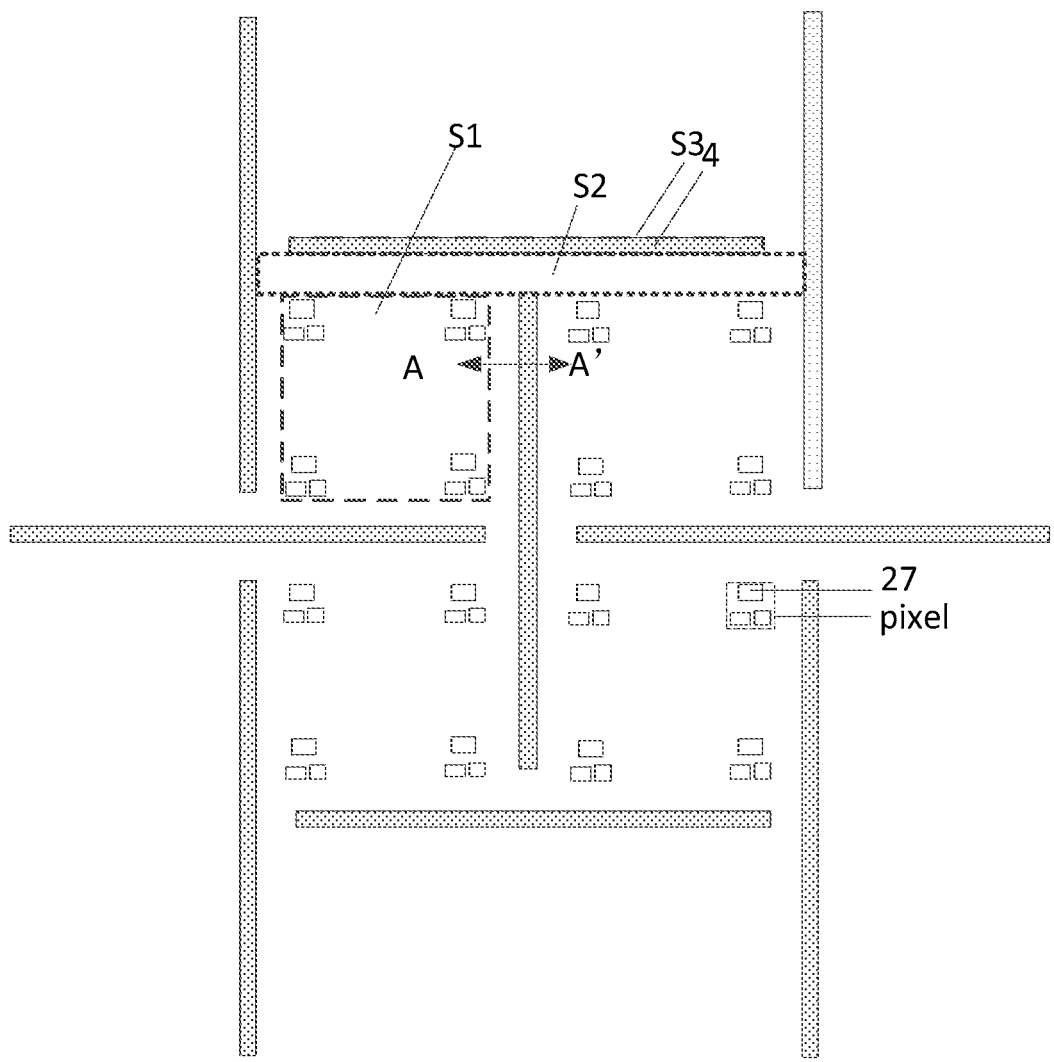
FIG. 1 shows a schematic structural diagram of a display panel provided by an embodiment of the disclosure.

In order to make the objectives, technical solutions, and advantages of the embodiments of the disclosure clearer, the technical solutions in embodiments of the disclosure will be clearly and fully described in combination with the accompanying drawings of the embodiments of the disclosure. It is apparent that the described embodiments are some, but not all, embodiments of the disclosure. Also, embodiments and features in the embodiments of the disclosure may be combined with one another without conflict. Based on the described embodiments of the disclosure, all other embodiments attainable by those ordinarily skilled in the art without involving any inventive effort are within the scope of the disclosure.

Unless otherwise defined, the technical terms or scientific terms used in the disclosure shall have the usual meanings understood by those of ordinary skill in the art to which the disclosure belongs. "First", "second" and similar words used in the disclosure do not indicate any order, quantity or importance, but are only used to distinguish different components. "Comprise" or "include" or other similar words mean that the element or item appearing before the word covers elements or items listed after the word and their equivalents, but does not exclude other elements or items. "Connecting" or "connected" or other similar words are not limited to physical or mechanical connections, but may include electrical connections, whether direct or indirect.

It should be noted that the dimensions and shapes of the various figures in the drawings are not to scale and are only intended to be merely illustrative of the disclosure. The same or similar reference numerals refer to the same or similar elements or elements having the same or similar functions throughout.

The inventors find that there are many ways to achieve stretchable display, in which after a display pixel unit is prepared on a flexible substrate, various opening are designed on the substrate so as to achieve the stretchability of display. This method is a feasible solution which is currently most likely to be into mass production. However, by providing openings in the substrate, the stretch strength of the substrate is inevitably reduced while the stretch performance of display is improved. A large number of simulation and experimental results show that there is a stress concentration phenomenon at the corners of the opening during stretching. Therefore, fracture cracks first appear at the corners of the opening during stretching. At present, for the stretchable display provided with this kind of opening, the maximum stretchable strain cannot exceed 3%, which limits the stretchability of a stretchable display device and increases the risk of failure of the display device.

Figure 2:
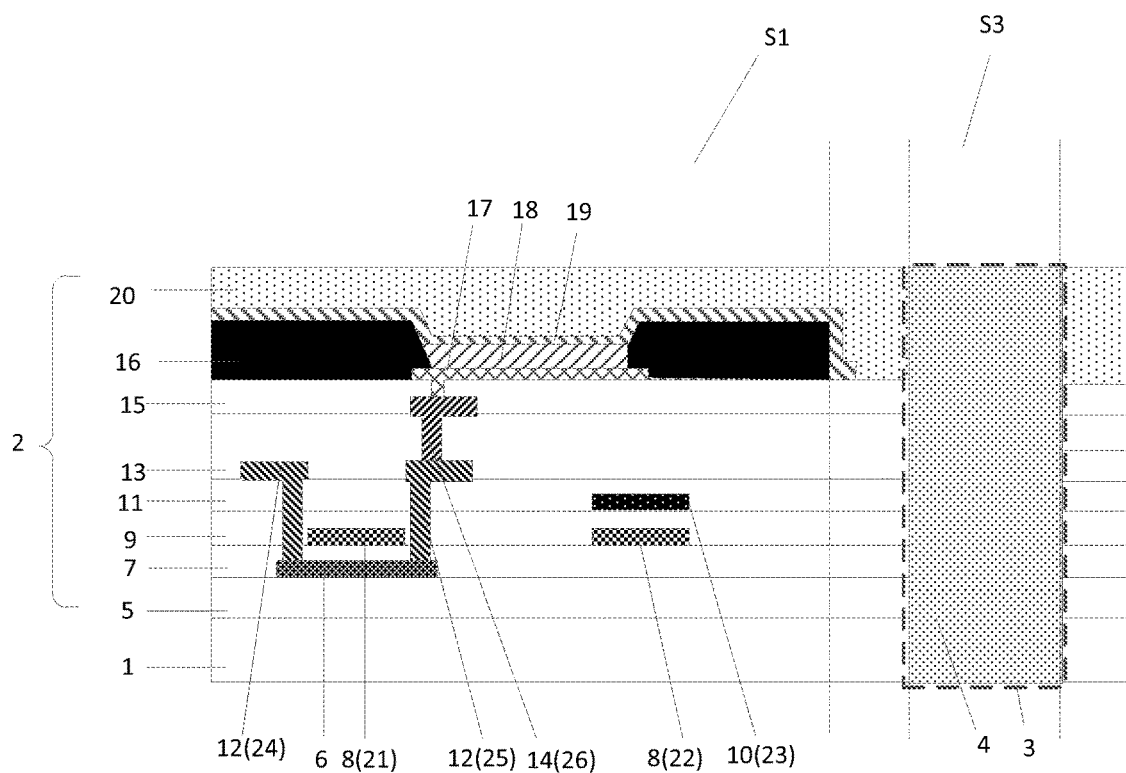
FIG. 2 shows a schematic structural diagram of another display panel provided by an embodiment of the disclosure.
Figure 3:
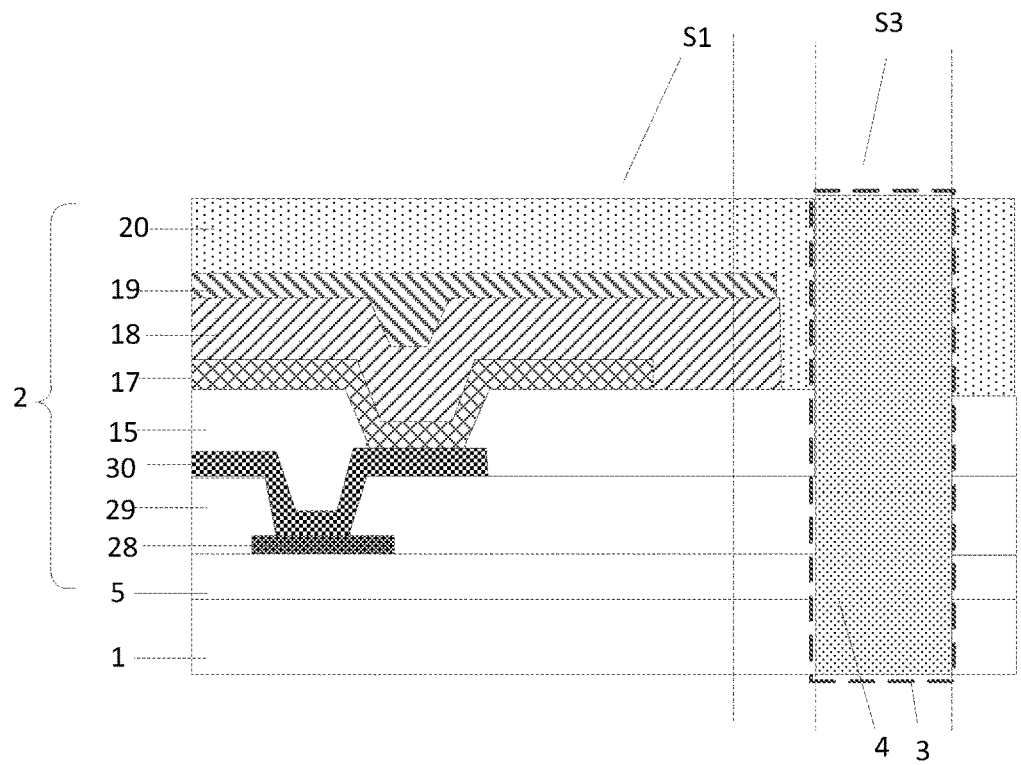
FIG. 3 shows a schematic structural diagram of yet another display panel provided by an embodiment of the disclosure.

An embodiment of the disclosure provides a display panel, as shown in FIG. 1, FIG. 2, and FIG. 3. FIG. 2 and FIG. 3 which are cross-sectional views in a direction AA' in FIG. 1. The display panel includes: a base substrate 1, and a pixel circuit film layer 2 disposed on the base substrate 1. The display panel has a plurality of island regions S1, opening regions S3 between the adjacent island regions S1, and bridge regions S2 connecting the adjacent island regions S1. Where the plurality of island regions S1 are provided therein the base substrate 1 and the pixel circuit film layer 2; the opening regions S3 each is provided with a first via hole 3, and the first via hole 3 runs through the base substrate 1 and the pixel circuit film layer 2. The display panel further includes: deformable components 4 each filling the first via hole 3; where each deformable component 4 comprises an elastic material.

The display panel provided by the embodiment of the disclosure may be applied to a stretchable display product. In some embodiments, a material of the base substrate includes, for example, polyimide (PI).

In the display panel provided by the embodiments of the disclosure, each opening region is provided with the deformable component filling the first via hole, and each deformable component includes the elastic material, so that the edges of the film layers run through by the first via holes are covered by the elastic materials, so as not to crack during the stretching process, thereby improving the stretch strength and stretch deformation of the display panel, and improving the stretch performance of the display panel.

In some embodiments, as shown in FIG. 1, each island region S1 has at least one pixel, and each pixel includes three sub-pixel regions 27.

In some embodiments, each pixel may include a red sub-pixel region, a green sub-pixel region, and a blue sub-pixel region. The bridge regions S2 are provided therein signal lines (not shown) connecting the pixels in the adjacent island regions S1. The signal lines may be gate lines, data lines, or power lines, etc.

In some embodiments, each island region S1 may be rectangular, each opening region S3 may be strip-shaped, and each strip-shaped opening region S3 may be located in a gap between the corresponding two adjacent island regions S1, and has the same extension direction as the side edges of the island regions S1.

In some embodiments, as shown in FIG. 1, each island region may include four pixels.

In some embodiments, the display panel provided by the embodiment of the disclosure may be, for example, an electroluminescent display panel. The electroluminescent display panel may be, for example, an organic light emitting diode display panel, an inorganic light emitting diode display panel, or a quantum dot light emitting diode display panel. The organic light emitting diode display panel may be, for example, an active matrix OLED (AMOLED) or a passive matrix OLED (PMOLED).

In some embodiments, a pixel circuit of the AMOLED includes, for example, a thin film transistor and a light emitting device. As shown in FIG. 2, the pixel circuit film layer 2 includes: a buffer layer 5, an active layer 6, a first gate insulating layer 7, a first metal layer 8, a second gate insulating layer 9, a second metal layer 10, an interlayer dielectric layer 11, a third metal layer 12, a first planarization layer 13, a fourth metal layer 14, a second planarization layer 15, a pixel definition layer 16, an anode 17, a light emitting functional layer 18, a cathode 19, and an encapsulation layer 20. The first metal layer 8 includes a gate 21 and a first electrode 22 of a capacitor. The second metal layer 10 includes a second electrode 23 of the capacitor. The third metal layer 12 may specifically include a source 24 and a drain 25. The fourth metal layer 14 may include an overlap electrode 26, and the overlap electrode 26 is connected with the drain 25, for example. The encapsulation layer includes, for example, an inorganic encapsulation layer and an organic encapsulation layer disposed on the inorganic encapsulation layer. In some embodiments, besides the signal lines connecting the pixels in the adjacent island regions, each bridge region is further provided therein insulating layers such as the first gate insulating layer, the second gate insulating layer, the interlayer dielectric layer, the first planarization layer, and the encapsulation layer.

In some embodiments, as shown in FIG. 3, the pixel circuit film layer 2 of the PMOLED structure includes: a buffer layer 5, a fifth metal layer 28, a first insulating layer 29, a sixth metal layer 30, a second planarization layer 15, an anode 17, a light emitting functional layer 18, a cathode 19, and an encapsulation layer 20. The sixth metal layer 30 includes a connecting lead connecting the fifth metal layer 28 with the anode 17.

In some embodiments, the elastic materials may be transparent elastic materials or opaque elastic materials.

In some embodiments, the elastic modulus of the elastic materials is 10 KPa to 20 MPa. That is, in the display panel provided by the embodiment of the disclosure, the elastic materials included in the deformable components have a relatively low elastic modulus, and thus great deformation can be caused by applying a small stress to the deformable components, which further improves the stretch performance of the display panel.

In some embodiments, the elastic material includes one or a combination of the following: polydimethylsiloxane (PDMS), thermoplastic polyurethanes (TPU) and rubber.

In some embodiments, each deformable component further includes: a plurality of particles uniformly dispersed in the elastic material, and the particles include: water absorbent particles and/or readily oxidizable particles.

In the display panel provided by the embodiment of the disclosure, the deformable components further include the water absorbent particles and/or readily oxidizable particles uniformly dispersed in the elastic materials, and the particles easily react with water and oxygen, so that the erosion of water and oxygen in the external environment on the display panel can be further reduced, and the encapsulation performance of the display panel is improved while the stretch performance of the stretchable display panel is improved.

In some embodiments, the water absorbent particles include, for example, calcium fluoride and lithium fluoride. The readily oxidizable particles include, for example, active metals such as magnesium and silver.

In some embodiments, a material of the particles includes one or a combination of the following: calcium fluoride, lithium fluoride, magnesium and silver.

In some embodiments, the diameter of the particles is: 10 nm to 10 μm.

Figure 4:
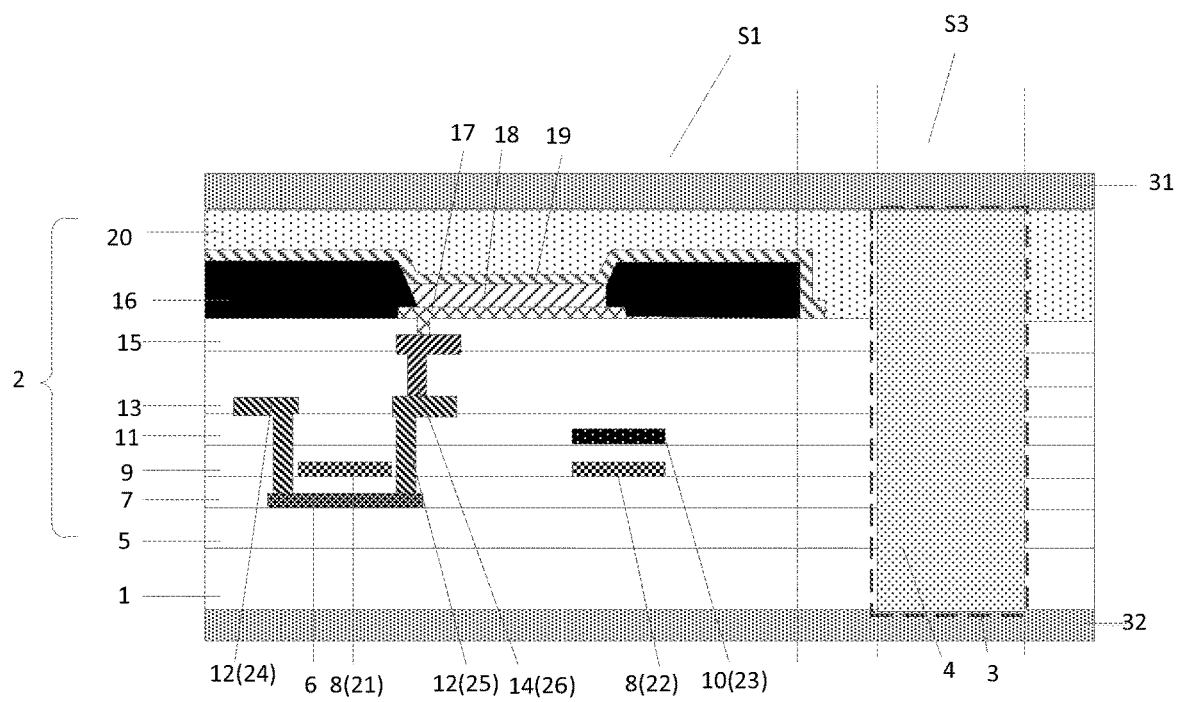
FIG. 4 shows is a schematic structural diagram of yet another display panel provided by an embodiment of the disclosure.
Figure 5:
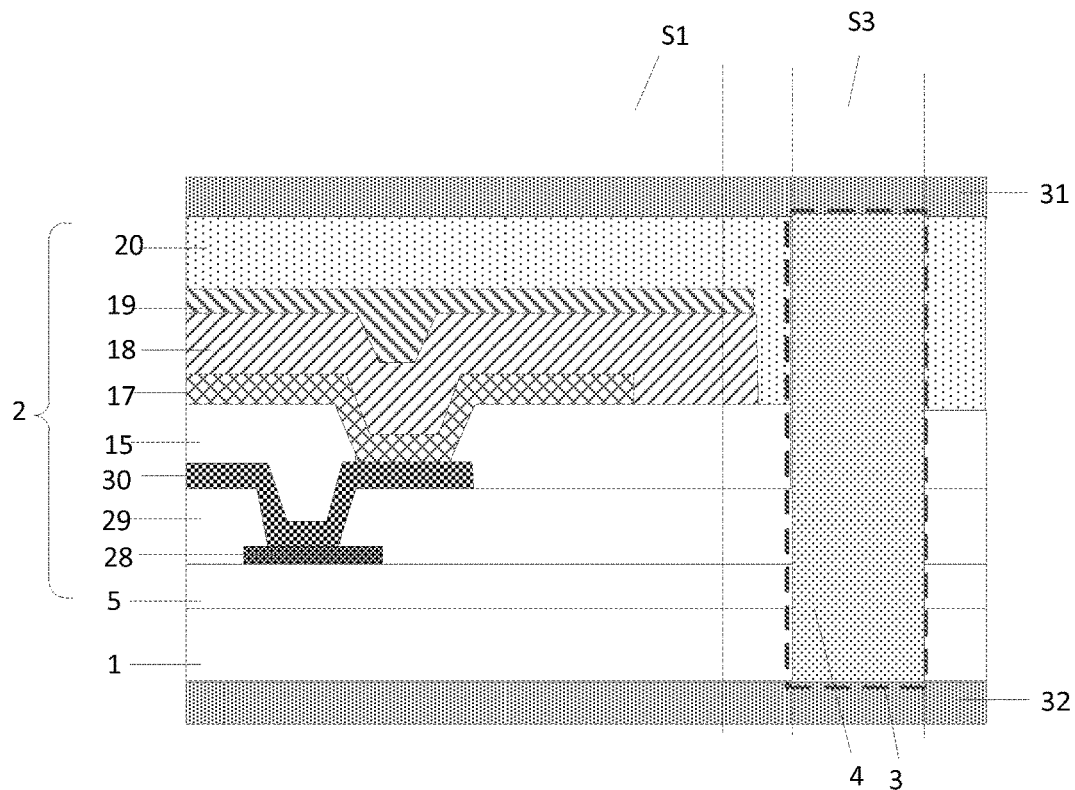
FIG. 5 shows a schematic structural diagram of yet another display panel provided by an embodiment of the disclosure.

In some embodiments, as shown in FIGS. 4 and 5, the display panel further includes: a first protective layer 31 on a side, facing away from the base substrate 1, of the pixel circuit film layer 2, and a second protective layer 32 on a side, facing away from the pixel circuit film layer 2, of the base substrate 1.

The first protective layers 31 and the second protective layers 32 cover the deformable components 4.

In some embodiments, the first protective layers and the second protective layers include elastic materials.

In other words, the first protective layers and the second protective layers are elastic film layers. In the display panel provided by the embodiment of the disclosure, the first protective layers and the second protective layers include the elastic materials, and cover the deformable components, that is, the edges of the first via holes are completely covered by the elastic materials, thereby more effectively preventing the film layers run through by the first via holes from cracking at the corners of the first via holes, and further improving the stretch performance of the display panel.

In some embodiments, the first protective layers and the second protective layers include transparent elastic materials, so as to avoid affecting the transmittance of the display panel.

In some embodiments, the first protective layers and the second protective layers include the same elastic materials as the deformable components.

In some embodiments, the elastic moduli of the elastic materials in the first protective layers and the second protective layers are 10 KPa to 20 MPa, that is, the elastic materials included in the first protective layers and the second protective layers have a relatively low elastic moduli, and thus great deformation can be caused by applying a small stress to the deformable components, which further improves the stretch performance of the display panel.

Figure 6:
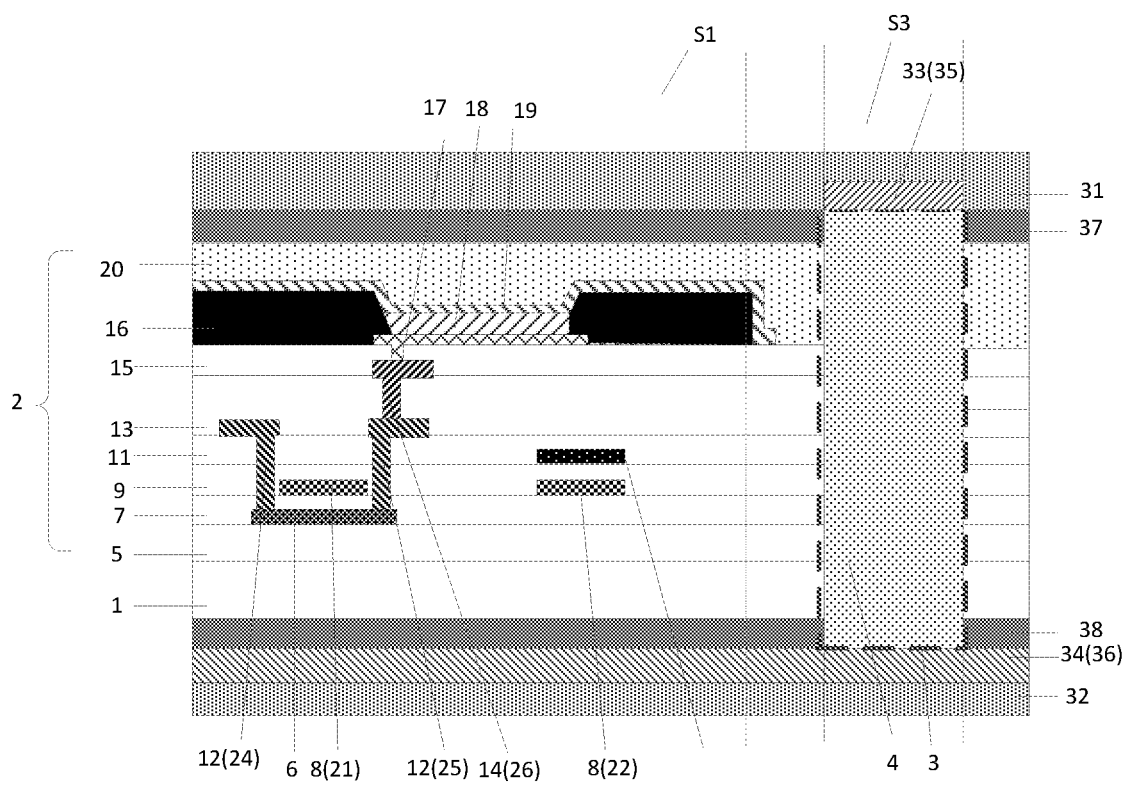
FIG. 6 shows a schematic structural diagram of yet another display panel provided by an embodiment of the disclosure.
Figure 7:
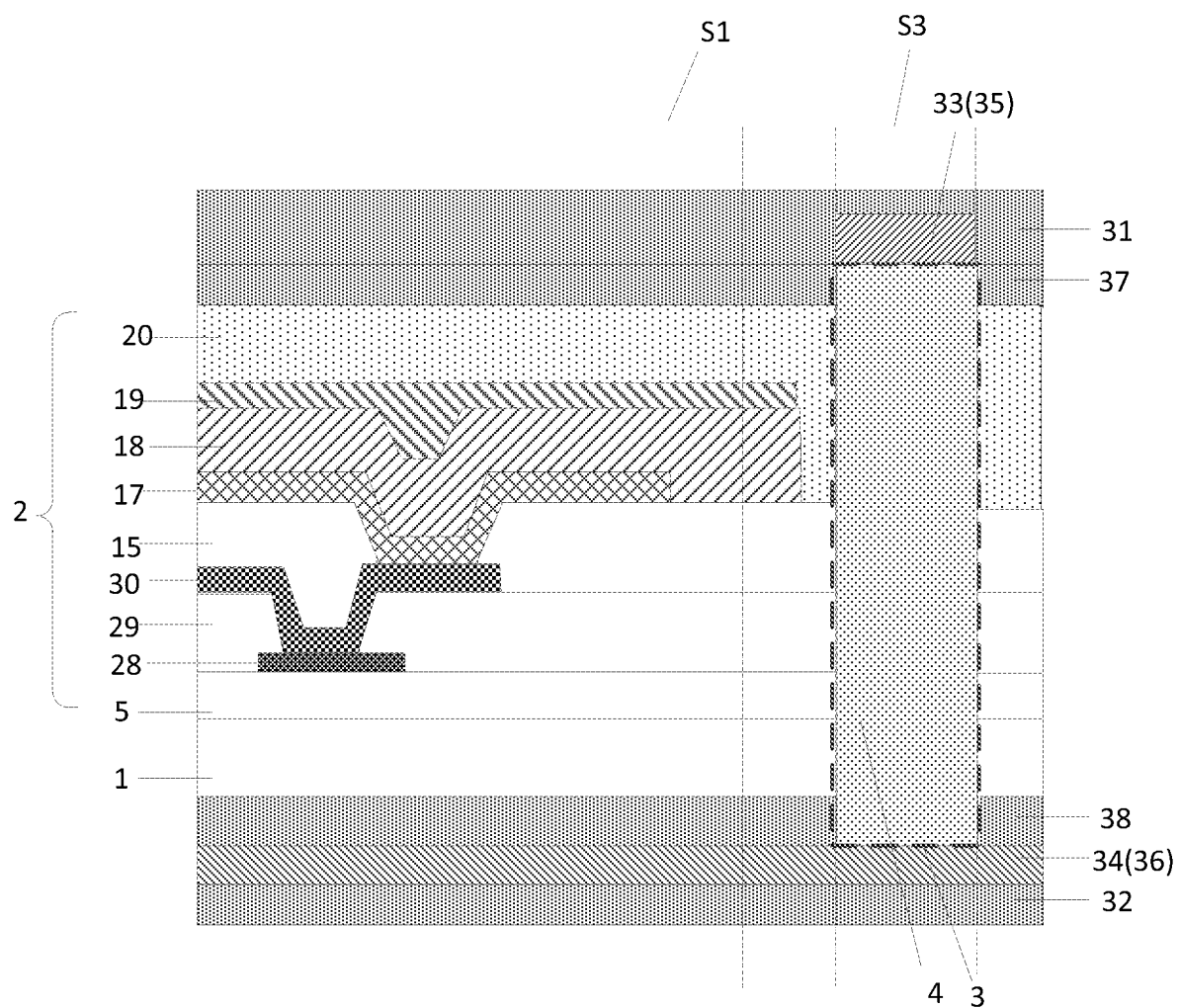
FIG. 7 shows a schematic structural diagram of yet another display panel provided by an embodiment of the disclosure.

In some embodiments, as shown in FIGS. 6 and 7, the display panel further includes: a first electrode layer 33 between the first protective layer 31 and the deformable component 4, and a second electrode layer 34 between the second protective layer 32 and the deformable component 4.

In each opening region S3, an orthographic projection of the first electrode layer 33 on the base substrate overlaps an orthographic projection of the second electrode layer 34 on the base substrate, and the first electrode layer 33 and the second electrode layer 34 are in contact with the deformable component 4.

FIG. 6 uses the AMOLED as an example for illustration, and FIG. 7 uses the PMOLED as an example for illustration.

It should be noted that, in the display panel provided by the embodiment of the disclosure, each opening region is provided with the first electrode layer and the second electrode layer respectively located on both sides of the deformable component, and the first electrode layers and the second electrode layers are in contact with the deformable components. Therefore, in each opening region, the first electrode layer, the second electrode layer, and the deformable component constitute a sensing unit. The operation of applying force, such as touching, stretching, and twisting the display panel, will cause deformation of the display panel. When the display panel is deformed, correspondingly, the deformable components are also deformed, so that each sensing unit formed by the first electrode layer, the second electrode layer and the deformable component can detect the deformation. For example, electrical signals can be provided for the first electrode layers and the second electrode layers. When a signal fed back by each sensing unit changes, it is considered that a region corresponding to the sensing unit is deformed, and deformation parameters such as stress and strain can be determined according to the feedback signal. Therefore, the display panel provided by the embodiment of the disclosure can realize stress and strain detection. When touch occurs, a region, corresponding to the touch position, of the display panel is deformed, causing the deformable components to deform, so that the touch position can be determined according to the deformed position, so as to realize detection of the touch.

In the display panel provided by the embodiment of the disclosure, each sensing unit is constituted by the first electrode layer, the second electrode layer and the deformable component, and when the deformation of the display panel causes the deformable components to deform, the deformation can be detected, thereby realizing detection on stress, strain, touch, etc., increasing the functions of the display panel and increasing the disclosure scenarios of the display panel.

In some embodiments, as shown in FIGS. 6, 7, 8 and 9, the first electrode layer 33 includes: first electrodes 35 corresponding to the deformable components in one-to-one correspondence, and first connecting leads (not shown) electrically connected with the first electrodes 35. A projection of each first electrode 35 on the base substrate 1 overlaps a projection of the corresponding deformable component 4 on the base substrate 1.

In some embodiments, as shown in FIGS. 6 and 7, the second electrode layer 34 includes a planar electrode 36 disposed on an entire surface.

The second electrode layer further includes a second connecting lead electrically connected with the planar electrode.

Figure 8:
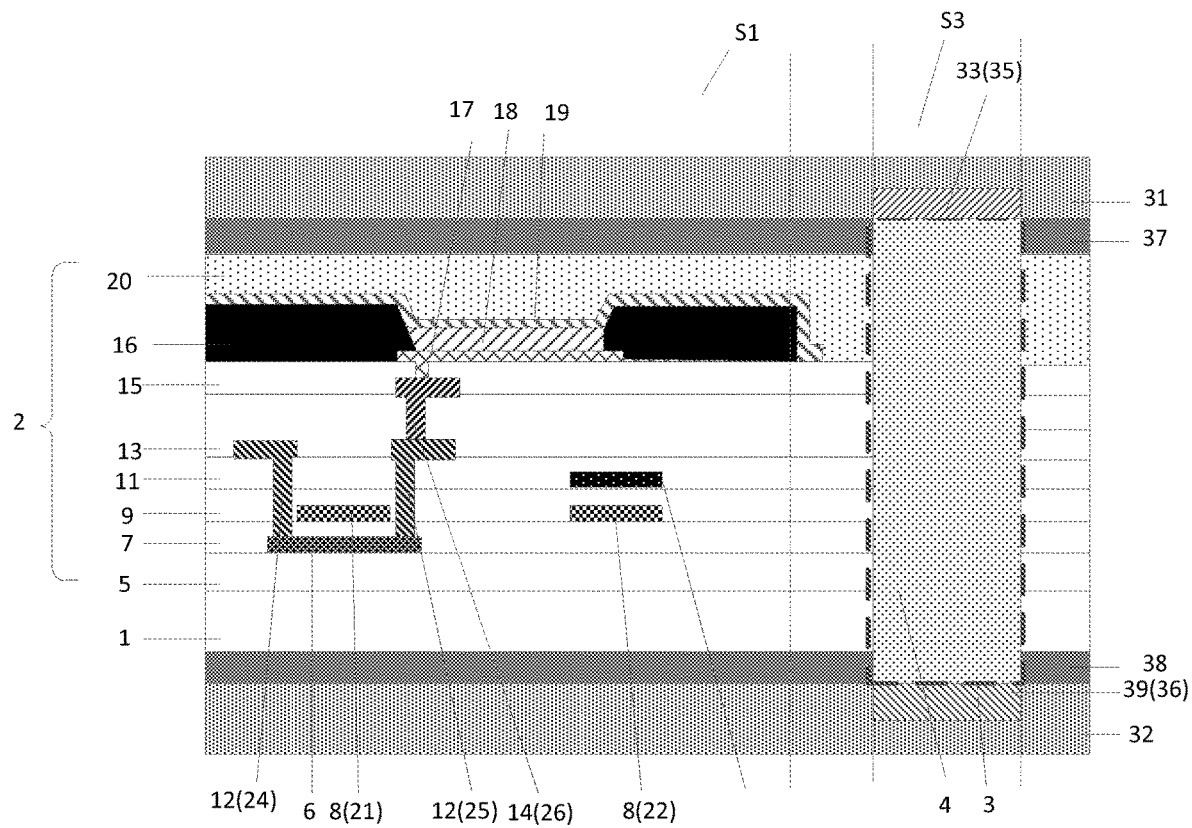
FIG. 8 shows a schematic structural diagram of yet another display panel provided by an embodiment of the disclosure.
Figure 9:
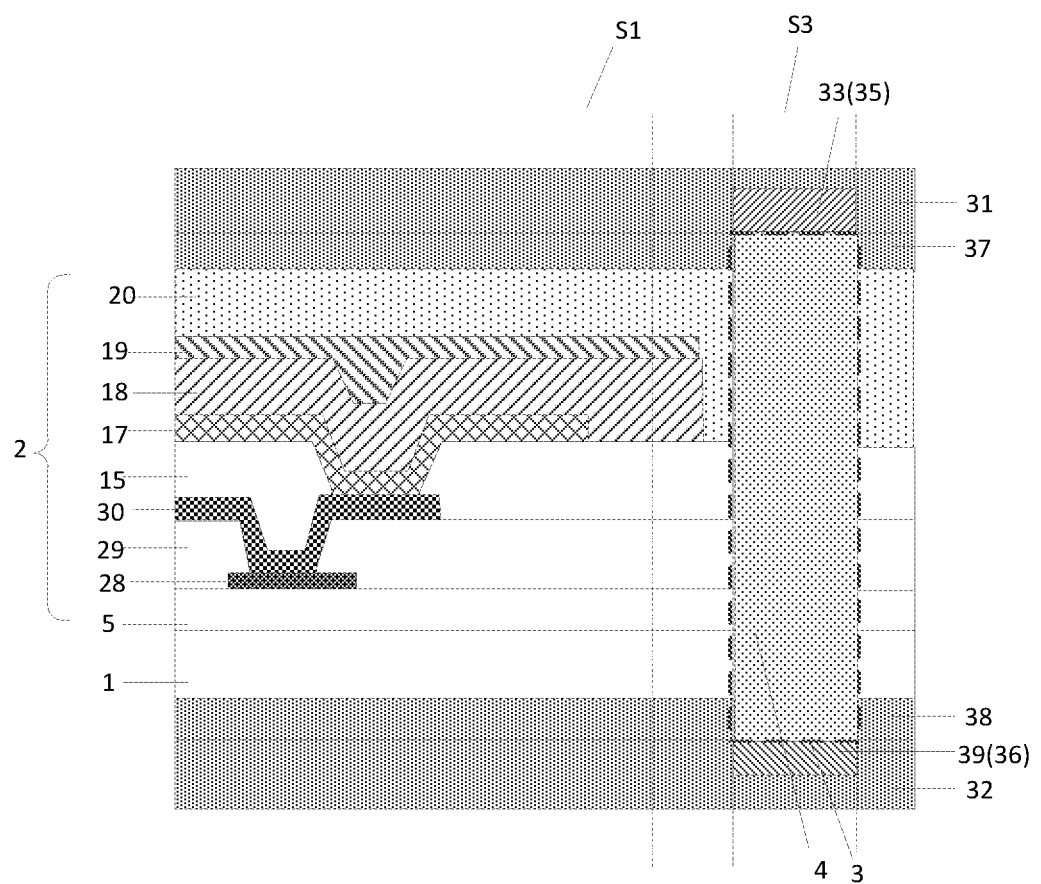
FIG. 9 shows is a schematic structural diagram of yet another display panel provided by an embodiment of the disclosure.

Alternatively, in some embodiments, as shown in FIGS. 8 and 9, the second electrode layer 34 includes second electrodes 39 corresponding to the deformable components in one-to-one correspondence, and second connecting leads electrically connected with the second electrodes 39. An orthographic projection of each first electrode 35 on the base substrate 1 overlaps an orthographic projection of the corresponding second electrode 39 on the base substrate 1.

In some embodiments, materials of the first electrode layers and the second electrode layers may include metal materials, and may also include materials such as carbon nanotubes, graphene, and metal nanowires.

In some embodiments, the first electrode layers, the deformable components, and the second electrode layers may constitute capacitive sensing units. By changing the area or distance between each first electrode layer and the corresponding second electrode layer, stress and strain can be detected, or, touch can be detected.

Alternatively, in some embodiments, the first electrode layers, the deformable components, and the second electrode layers may constitute piezoresistive sensing units, and when the deformable components are deformed, resistances of the piezoresistive sensing units change.

When the first electrode layers, the deformable components, and the second electrode layers constitute the piezoresistive sensing units, in some embodiments, a deformable structure further includes: conductive portions uniformly dispersed in the elastic materials.

In some embodiments, the conductive portions may be conductive particles, and the conductive particles may be, for example, metal particles or carbon black particles. The size of the conductive particles may be, for example, 10 nm to 1 μm. The conductive portions may also be conductive fibers, and the conductive fibers may be, for example, carbon nanotubes or graphene.

In some embodiments, the conductive portions include one or a combination of the following: metal particles, carbon black particles, carbon nanotubes, and graphene.

In some embodiments, as shown in FIGS. 6 and 7, the display panel further includes: a first encapsulation layer 37 between the first electrode layer 33 and the pixel circuit film layer 2, and a second encapsulation layer 38 between the second electrode layer 34 and the base substrate 1. The first via hole 3 also runs through the first encapsulation layer 37 and the second encapsulation layer 38. The first encapsulation layer 37 and the second encapsulation layer 38 include elastic materials.

It should be noted that when the display panel includes a sensor structure, the first encapsulation layers, the second encapsulation layers and the deformable structures all include elastic materials, so that the edges of the base substrate and the pixel circuit film layer run through by the first via holes are completely covered by the elastic materials, thereby more effectively preventing the base substrate and the pixel circuit film layer run through by the first via holes from cracking at the corners of the first via holes, and further improving the stretch performance of the display panel.

In some embodiments, the first encapsulation layers and the second encapsulation layers include transparent elastic materials, so as to avoid affecting the transmittance of the display panel.

In some embodiments, the first encapsulation layers and the second encapsulation layers include the same elastic materials as the deformable components.

In some embodiments, elastic moduli of the elastic materials in the first encapsulation layers and the second encapsulation layers are 10 KPa to 20 MPa. In other words, the elastic materials included in the first encapsulation layers and the second encapsulation layers have low elastic moduli, and thus great deformation can be caused by applying a small stress to the deformable components, which further improves the stretch performance of the display panel.

In some embodiments, when the display panel includes the sensor structure, the first protective layers and the second protective layers covering the deformable components may be inorganic film layers or organic film layers, and the thickness of the first protective layers and the second protective layers may be, for example, 20 nm to 2000 nm.

Figure 10:
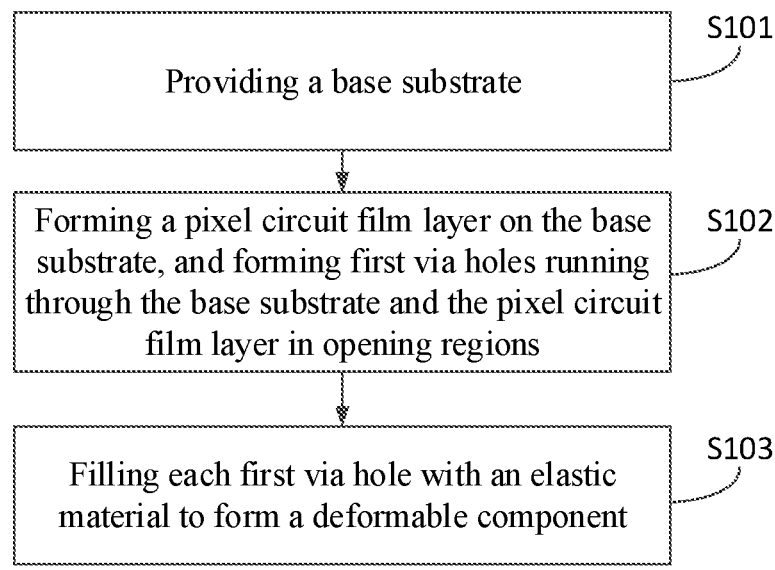
FIG. 10 shows a schematic diagram of a manufacturing method of a display panel provided by an embodiment of the disclosure.

Based on the same inventive concept, an embodiment of the disclosure also provides a manufacturing method of the display panel including: a plurality of island regions, opening regions located between the adjacent island regions, and bridge regions connecting the adjacent island regions. As shown in FIG. 10, the method includes:

S101: providing a base substrate;

S102: forming a pixel circuit film layer on the base substrate, and forming first via holes running through the base substrate and the pixel circuit film layer in the opening regions; and S103: filling each first via hole with an elastic material to form a deformable component.

In the manufacturing method of the display panel provided by the embodiment of the disclosure, the opening regions are provided with deformable components filling the first via holes, and the deformable components include the elastic materials, so that the edges of the film layers run through by the first via holes are covered by the elastic materials, so as not to crack during the stretching process, thereby improving the stretch strength and stretch deformation of the display panel, and improving the stretch performance of the display panel.

In some embodiments, when the display panel is an AMOLED panel, forming the pixel circuit film layer on the base substrate in S102 specifically includes:

forming a buffer layer, an active layer, a first gate insulating layer, a first metal layer, a second gate insulating layer, a second metal layer, an interlayer dielectric layer, a third metal layer, a first planarization layer, a fourth metal layer, and a second planarization layer are sequentially on the base substrate;

forming a pixel definition layer and an anode on the second planarization layer; and forming a light emitting functional layer, a cathode, and an encapsulation layer sequentially on the anode.

In some embodiments, when the display panel is a PMOLED panel, forming the pixel circuit film layer on the base substrate in step 102 specifically includes:

forming a buffer layer, a fifth metal layer, a first insulating layer, a sixth metal layer, and a second planarization layer sequentially on the base substrate;

forming a pixel definition layer and an anode on the second planarization layer; and forming a light emitting functional layer, a cathode, and an encapsulation layer sequentially on the anode.

In some embodiments, filling the first via holes with the elastic materials in S103 includes:

injecting the elastic materials into the first via holes by using a pouring or spraying or knife-coating process.

In some embodiments, the method further includes: the elastic materials are heated and dried, and cured.

In some embodiments, after the first via holes are filled with the elastic materials to form the deformable structure, the method further includes:

forming a first protective layer covering the deformable structure on a side, facing away from the corresponding base substrate, of the pixel circuit film layer; and forming a second protective layer covering the deformable structure on a side, facing away from the corresponding pixel circuit film layer, of the base substrate.

In some embodiments, the first protective layers and the second protective layers include elastic materials.

In some embodiments, the elastic materials may be coated by a knife-coating or liquid self-leveling process, and then when the temperature is lower than 100° C., the elastic materials are heated and dried and cured. In some embodiments, the heating and drying and curing processes of the deformable component, the first protective layers and the second protective layers may be performed in the same process flow.

In some embodiments, before the first protective layer covering the deformable structure is formed on the side, facing away from the corresponding base substrate, of the pixel circuit film layer, the method further includes:

forming a first electrode layer in contact with the deformable component on the side, facing away from the corresponding base substrate, of the pixel circuit film layer; and before the second protective layer covering the deformable structure is formed on the side, facing away from the corresponding pixel circuit film layer, of the base substrate, the method further includes:

forming a second electrode layer in contact with the deformable component on the side, facing away from the corresponding pixel circuit film layer, of the base substrate.

When the display panel includes the first electrode layers and the second electrode layers, before the first via holes are filled with the elastic materials to form the deformable structure, the method further includes:

forming a first encapsulation layer exposing the opening region on the side, facing away from the corresponding base substrate, of the pixel circuit film layer; and forming a second encapsulation layer exposing the opening region on the side, facing away from the corresponding pixel circuit film layer, of each base substrate.

In some embodiments, the first encapsulation layers and the second encapsulation layers include elastic materials. In some embodiments, the elastic materials may be coated by a knife-coating or liquid self-leveling process to form the first encapsulation layers and the second encapsulation layers respectively, and then when the temperature is lower than 100° C., the elastic materials are heated and dried and cured. In some embodiments, the heating and drying and curing processes of the deformable structure, the first protective layers and the second protective layers may be performed in the same process flow.

In some embodiments, when the display panel includes the first electrode layers and the second electrode layers, forming the first protective layers and the second protective layers may specifically include the step of coating with organic films or inorganic films.

An embodiment of the disclosure provides a display apparatus, and the display apparatus includes the display panel provided by the embodiment of the disclosure.

The display apparatus provided by the embodiment of the disclosure is: any product or component with a display function, such as a mobile phone, a tablet computer, a television, a display, a notebook computer, a digital photo frame, a navigator and a wearable product. Other essential components of the display apparatus will be apparent to those ordinarily skilled in the art and are not described in detail herein, nor should they be construed as limiting the disclosure. The display apparatus can be implemented by referring to the embodiment of the display panel, which is not repeated here.

To sum up, in the display panel, the manufacturing method of the display panel, and the display apparatus provided by the embodiments of the disclosure, the opening regions are provided with the deformable components filling the first via holes, and the deformable components include the elastic materials, so that the edges of the film layers run through by the first via holes are covered by the elastic materials, so as not to crack during the stretching process, thereby improving the stretch strength and stretch deformation of the display panel, and improving the stretch performance of the display panel.

It will be apparent to those skilled in the art that various modifications and variations can be made to the disclosure without departing from the spirit or scope of the disclosure. Hence, if these modifications and variations of the disclosure fall within the scope of the claims and their equivalents in the disclosure, then it is intended that the disclosure includes these modifications and variations.

What is claimed is:

1. A display panel, comprising:
   a base substrate; and
   a pixel circuit film layer disposed on the base substrate;
   wherein the display panel has a plurality of island regions, opening regions between the adjacent island regions, and bridge regions connecting adjacent island regions;
   wherein
      the base substrate and the pixel circuit film layer are provided in the plurality of island regions;
      the opening regions each is provided with a first via hole, and the first via hole runs through the base substrate and the pixel circuit film layer;
   wherein the display panel further comprises:
      deformable components each filling the first via hole; wherein each deformable component comprises an elastic material;
      a first protective layer on a side, facing away from the base substrate, of the pixel circuit film layer; and
      a second protective layer on a side, facing away from the pixel circuit film layer, of the base substrate;
         wherein both the first protective layer and the second protective layer cover the deformable components;
      a first electrode layer between the first protective layer and the deformable components; and
      a second electrode layer between the second protective layer and the deformable components;
         wherein in each opening region, an orthographic projection of the first electrode layer on the base substrate overlaps an orthographic projection of the second electrode layer on the base substrate; and both the first electrode layer and the second electrode layer are in contact with the deformable components.

2. The display panel according to claim 1, wherein each deformable component further comprises:
   a plurality of particles uniformly dispersed in the elastic material; wherein
      the plurality of particles comprise: water absorbent particles and/or readily oxidizable particles.

3. The display panel according to claim 2, wherein a diameter of the particles is 10 nm to 10 μm.

4. The display panel according to claim 2, wherein a material of the particles comprises one or a combination of following: calcium fluoride, lithium fluoride, magnesium, and silver.

5. The display panel according to claim 1, wherein an elastic modulus of the elastic material is 10 KPa to 20 MPa.

6. The display panel according to claim 5, wherein the elastic material comprises one or a combination of following: polydimethylsiloxane, thermoplastic polyurethanes, and rubber.

7. The display panel according to claim 1, wherein the first protective layer and the second protective layer comprise elastic materials.

8. The display panel according to claim 1, wherein
   the first electrode layer comprises:
      a plurality of first electrodes corresponding to the deformable components in one-to-one correspondence; and first connecting leads electrically connected with the first electrodes;
wherein a projection of each first electrode on the base substrate overlaps a projection of a corresponding deformable component on the base substrate;
and
the second electrode layer comprises a planar electrode disposed on an entire surface; or
the second electrode layer comprises:
a plurality of second electrodes corresponding to the deformable components in one-to-one correspondence; and
second connecting leads electrically connected with the second electrodes;
wherein an orthographic projection of each first electrode on the base substrate overlaps an orthographic projection of a corresponding second electrode on the base substrate.

9. The display panel according to claim 1, wherein each deformable component further comprises: conductive portions uniformly dispersed in the elastic material.

10. The display panel according to claim 9, wherein the conductive portions comprise one or a combination of following: metal particles, carbon black particles, carbon nanotubes, and graphene.

11. The display panel according to claim 1, further comprising:
a first encapsulation layer between the first electrode layer and the pixel circuit film layer; and
a second encapsulation layer between the second electrode layer and the base substrate;
wherein
each first via hole runs through the first encapsulation layer and the second encapsulation layer; and
the first encapsulation layer and the second encapsulation layer comprise elastic materials.

12. A manufacturing method of a display panel, wherein the display panel comprises: a plurality of island regions, opening regions located between the adjacent island regions, and bridge regions connecting the adjacent island regions;
wherein the method comprises:
providing a base substrate;
forming a pixel circuit film layer on the base substrate;
forming first via holes running through the base substrate and the pixel circuit film layer in the opening regions; and
filling each first via hole with an elastic material to form a deformable component;
wherein after each first via hole is filled with the elastic material to form the deformable component, the method further comprises:
forming a first protective layer covering the deformable component on a side, facing away from the base substrate, of the pixel circuit film layer; and
forming a second protective layer covering the deformable component on a side, facing away from the pixel circuit film layer, of the base substrate;
wherein before the first protective layer covering the deformable structure is formed on the side, facing away from the base substrate, of the pixel circuit film layer, the method further comprises:
forming a first electrode layer in contact with the deformable component on the side, facing away from the base substrate, of the pixel circuit film layer; and
before the second protective layer covering the deformable structure is formed on the side, facing away from the pixel circuit film layer, of the base substrate, the method further comprises:
forming a second electrode layer in contact with the deformable component on the side, facing away from the pixel circuit film layer, of the base substrate.

13. The method according to claim 12, wherein filling each first via hole with the elastic material comprises:
injecting the elastic material to each first via hole through a pouring or spraying or knife-coating process.

14. A display apparatus, comprising a display panel, wherein the display panel comprises:
a base substrate; and
a pixel circuit film layer disposed on the base substrate;
wherein the display panel has a plurality of island regions, opening regions between the adjacent island regions, and bridge regions connecting adjacent island regions;
wherein
the base substrate and the pixel circuit film layer are provided in the plurality of island regions;
the opening regions each is provided with a first via hole, and the first via hole runs through the base substrate and the pixel circuit film layer;
wherein the display panel further comprises:
deformable components each filling the first via hole; wherein each deformable component comprises an elastic material;
a first protective layer on a side, facing away from the base substrate, of the pixel circuit film layer; and
a second protective layer on a side, facing away from the pixel circuit film layer, of the base substrate;
wherein both the first protective layer and the second protective layer cover the deformable components;
a first electrode layer between the first protective layer and the deformable components; and
a second electrode layer between the second protective layer and the deformable components;
wherein in each opening region, an orthographic projection of the first electrode layer on the base substrate overlaps an orthographic projection of the second electrode layer on the base substrate; and both the first electrode layer and the second electrode layer are in contact with the deformable components.

15. The display apparatus according to claim 14, wherein each deformable component further comprises:
a plurality of particles uniformly dispersed in the elastic material; wherein
the plurality of particles comprise: water absorbent particles and/or readily oxidizable particles.

16. The display apparatus according to claim 14, wherein an elastic modulus of the elastic material is 10 KPa to 20 MPa.

* * * * *